United States Patent

[11] 3,622,856

[72] Inventor Gordon Willis
Cambridge, Mass.

[21] Appl. No. 850,785
[22] Filed Aug. 18, 1969
[45] Patented Nov. 23, 1971
[73] Assignee Computervision Corporation
Waltham, Mass.

[54] AUTOMATIC PLANAR PHOTOELECTRIC REGISTRATION ASSEMBLY AND SERVO DRIVING APPARATUS THEREFOR
4 Claims, 4 Drawing Figs.

[52] U.S. Cl. .......... 318/640, 318/685, 318/574
[51] Int. Cl. .......... G05b 1/06
[50] Field of Search .......... 318/685, 690

[56] References Cited

UNITED STATES PATENTS 2,941,136 6/1960 Marantette et al. .......... 318/(20.860)
3,414,785 12/1968 Orahood et al. .......... 318/(20.860 X)
3,448,280 6/1969 Blitchington, Jr. et al. 318/(20.605 UX)
3,457,422 7/1969 Rottmann .......... 318/(20.605 UX)
3,466,514 9/1969 Brunner et al. .......... 318/(20.605 X)

*Primary Examiner*—T. E. Lynch
*Attorney*—Chittick, Pfund, Birch, Samuels and Gauthier

ABSTRACT: A device for registering a movable object with another object by moving the movable object through a plane has means for generating X and Y off-register signals which are coupled to X and Y step motors. The step motors are in turn coupled to X and Y lead shafts, each shaft being parallel to a common plane and having a reciprocative element mounted thereon for linear movement in response to rotation of the respective lead shaft. A floating plate is pivotally connected to the two reciprocative elements by two linkage means for movement in a plane parallel to the lead shafts. A mechanical linkage interconnects the floating plate and the movable object to translate the floating plate motion to the movable object to accomplish registration.

INVENTOR.
GORDON WILLIS

BY

Chittick, Pfund, Birch, Samuels & Gauthier

INVENTOR

GORDON WILLIS

BY

Chittick, Pfund, Birch, Samuels & Gauthier

ATTORNEYS

INVENTOR.
GORDON WILLIS
BY
Chittick, Pfund, Birch, Samuels & Gauthier

AUTOMATIC PLANAR PHOTOELECTRIC REGISTRATION ASSEMBLY AND SERVO DRIVING APPARATUS THEREFOR

This invention generally relates to a driving mechanism for moving a member through a plane and is more particularly directed to an assembly utilizing the driving mechanism to automatically bring two objects into planar registration.

In the production of solid state silicon transistor wafers, it is necessary to bring circuit targets printed on the wafers into precise register with complementary transparent targets provided on an otherwise opaque mask before exposing the wafer-mask sandwich to ultraviolet light to produce a conductive circuit on the exposed wafer surface. To accomplish such registration, heretofore known mask-wafer registration exposure devices have provided a manually movable chessman which is connected to a turntable on which the wafer is mounted through a reduction linkage. The chessman may be manually slid over a horizontal table to induce a corresponding but reduced planar motion to the wafer to align the wafer target with the mark targets. The operator must view the mask-wafer relationship through a microscope and manually manipulate the chessman to establish planar registration. Since the registration tolerance image is normally about 1 micron, this manual alignment procedure has proven to be both unduly time consuming and fatiguing to the operator. It is, therefore, highly desirable to provide a means for automatically registering the wafer and mask.

In accordance with this invention, a wafer-mask alignment device has photoelectric detectors positioned adjacent the wafer-mask sandwich to produce X and Y offset signals indicating an off-register position relative to the plane in which the sandwich lies. The X and Y signals so generated are connected to X and Y motors, respectively, which motors are preferably secured to a table disposed parallel to the mask-wafer plane with their respective lead shafts also disposed parallel to that plane and preferably at right angles to each other. Rotary to linear motion conversion units, such as Roh'lix units, are mounted on each lead shaft so as to reciprocate along the lead shafts in response to actuation of the motors. A floating plate is secured to the two reciprocative elements by two linkage means pivotally secured at each end to the floating plate and to the respective reciprocative elements so as to enable the floating plate to move in a plane parallel to the wafer-mask plane in response to movement of the reciprocative elements. To insure that the floating plate does not rotate during its planar movement, it is desirable that one of the linkage means comprise two links of equal length pivotally secured to the floating plate and its reciprocative elements at equally spaced points.

In operation the operator of the alignment and exposure device may, if necessary, manually bring the wafer and mask into rough registration by moving the chessman over the floating plate. Thereafter, the chessman is locked to the floating plate as by a vacuum and the photoelectric detectors are energized. The driving motors and associated linkage of the driving mechanism then automatically translate the the X and Y off-register signals into planar motion of the floating plate to bring the wafer and mask targets into registration. To facilitate registration, the linkage preferably provides for nonrotative planar motion of the floating plate.

The electromechanical servomechanism provided by the invention automatically accomplishes registration to significantly reduce the production time needed to perform this function in contrast to prior manual methods, thereby increasing the efficiency of the operation.

Moreover, by eliminating the human element, the present invention increases the precision with which registration is accomplished while decreasing operator fatigue.

It is, therefore, an object of the invention to provide a means for automatically registering a movable object with a stationary object.

Another object of the invention is to provide an apparatus for moving and positioning an object in a predetermined plane.

These and further objects, features and advantages of the invention will become more apparent as the description proceeds with continued reference to the drawings wherein.

Figure 1:
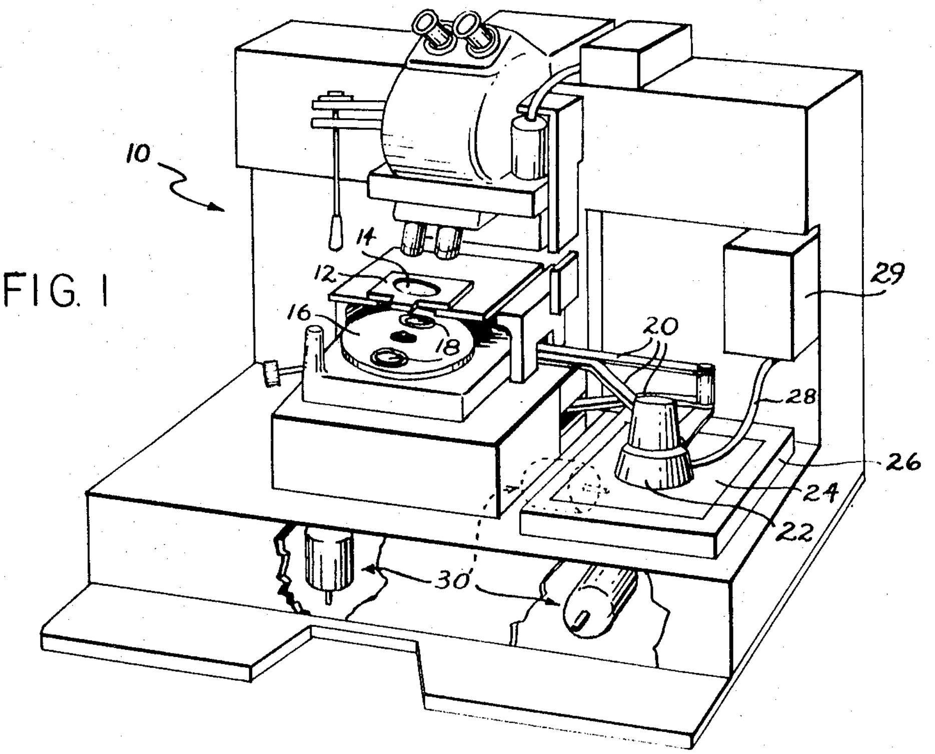
FIG. 1 is a schematic perspective view of a mask-wafer alignment device incorporating the present invention.

Referring initially to FIG. 1, a wafer to mask alignment device 10 of the type manufactured by Photo-Lithographic Products, a division of Kulicke and Soffa Industries, Inc., under model number 686 is shown as including a mask holder 12 for securely mounting a mask 14 in a generally horizontal plane and a turntable 16 upon which two wafers 18 are securely mounted on two chucks 19 as by a vacuum lock. The turntable 16 is disposed parallel to the mask and may be moved within its plane by a reduction linkage 20 secured at one end to the turntable 16 and at the other end to a chessman 22. The chessman in turn rests on a chessman plate 24 lying on a horizontal base table 26 and is vacuum locked to the chessman plate 24 by a vacuum hose 28 leading from a vacuum pump 29. The chessman vacuum lock is weak enough to be manually overridden so that the chessman 22 may be manually slid over the chessman plate 24 without moving that plate, but when manual pressure is released, the chessman 22 and the chessman plate 24 will move together. It should, therefore, be apparent that the wafer 18 may be brought into planar register with the mask 14 by horizontal movement of the chessman 22, which movement is transmitted to the turntable 16 in reduced form through the reduction linkage 20. To accomplish this function automatically, a planar driving apparatus generally indicated at 30 for driving the chessman plate 24 is provided on the underside of the table 26.

Figure 3:
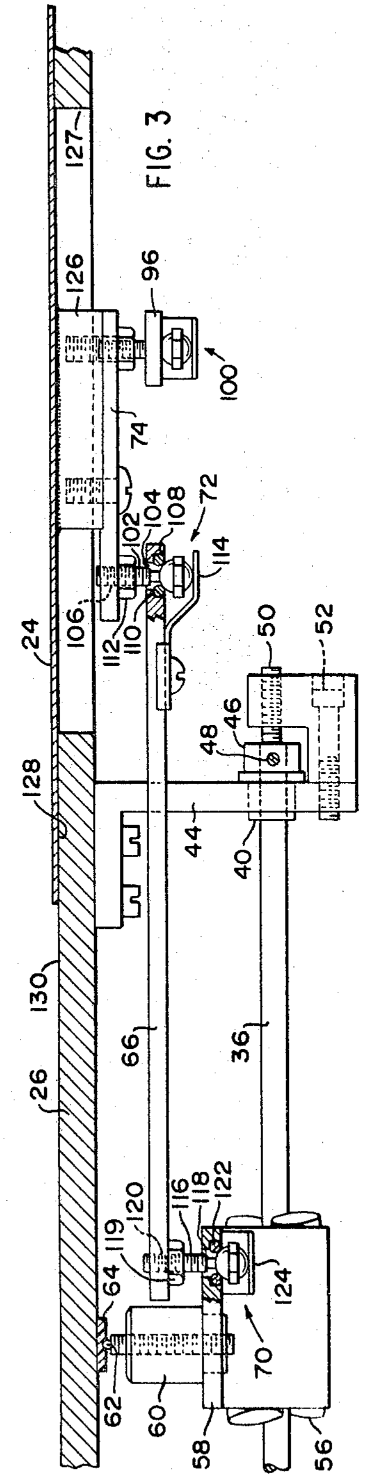
FIG. 3 is a side elevation, partially in section, taken along line 3—3 of FIG. 2.
Figure 2:
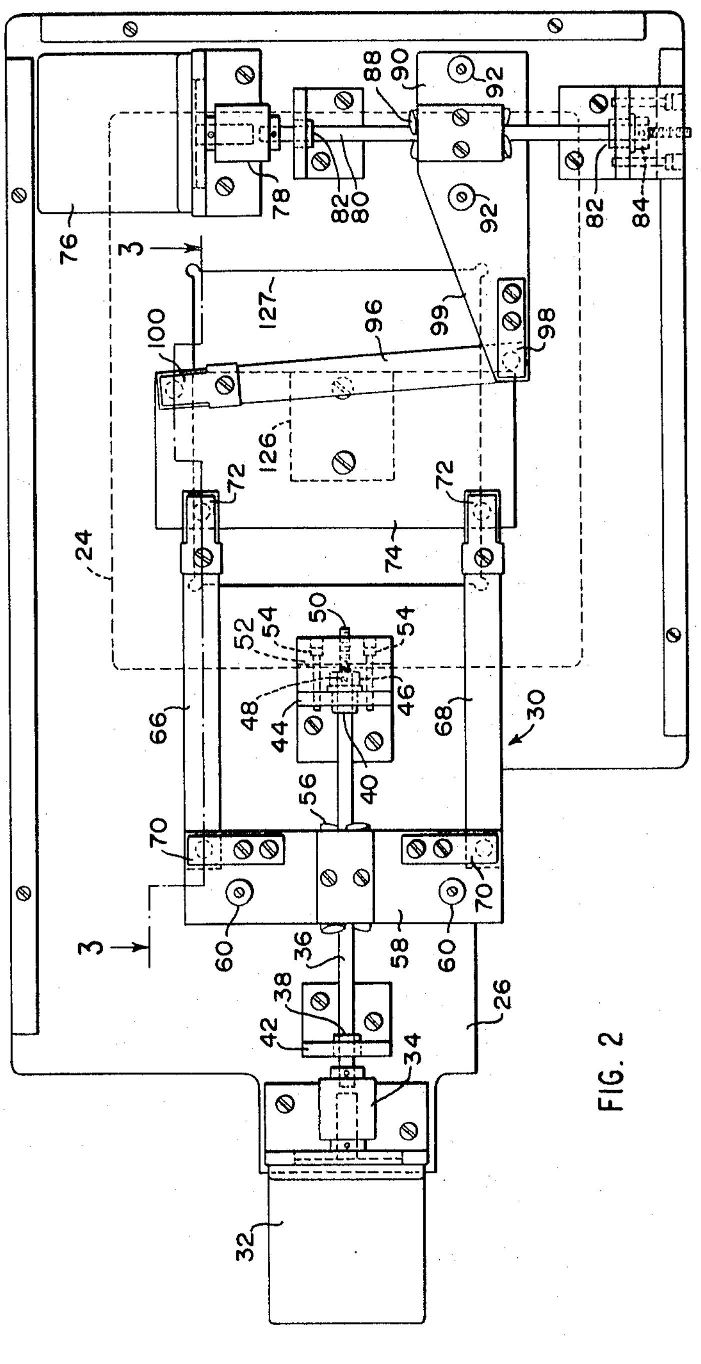
FIG. 2 is a bottom plan view taken along line 2—2 of FIG. 1 showing the driving apparatus of the invention.

The driving apparatus 30 is best seen with reference to FIGS. 2 and 3 wherein a first or X step driving motor 32 is secured to the bottom of the table 26 upon an appropriate bracket. The drive shaft of the X motor 32 is connected through a flexible coupling 34 to an X lead shaft 36, which shaft is disposed parallel to the table 26 and is journaled for rotation in appropriate bearings 38, 40, mounted on the bottom of the table upon brackets 42, 44, respectively. Axial displacement of the X lead shaft 36 is prevented by the interaction of a collar 46 securely mounted on the outer end of the shaft as by a setscrew 48, to bear against the outer surface of the bracket 44 and a spring-loaded plunger 50 which is mounted in an opposed bracket 52. Two spacer screws 54 interconnect the two brackets 44 and 52 to force the plunger 50 against the end of the lead shaft 36, thereby forcing the collar 46 against bracket 44 to stabilize the axial position of the shaft 36.

A rotary to linear motion conversion unit, such as a Roh'lix unit 56, is mounted on the shaft intermediate the bearings 38 and 40. A first or X reciprocative plate 58 disposed substantially perpendicularly to the shaft axis is secured to the unit 56 as by screws. It should be apparent that rotation of the lead shaft in either direction will cause a corresponding linear motion of the reciprocative plate 58 along the axis of the shaft 36. Of course, many other rotary to linear conversion units which may be employed in conjunction with the motor will be apparent to those skilled in the art, such as for example providing a threaded lead shaft 36 and mounting a threaded nut or the like thereon. To maintain the plate 58 in a position parallel to the table 26, two stakes 60 (see FIG. 3) are secured to the plate 58 as by force fitting. Mounted within each state is a spring loaded plunger 62, which plunger has a nylon point bearing against a shoe 64 of antifriction material such as Teflon separating the plunger from the bottom of the table to lubricate movement of the plate 58 along the bottom of the table 26.

A first or X linkage means includes two X links 66 and 68 pivotally secured to one end 70, 70' to the lateral ends of the reciprocative plate 58 and at the other end 72, 72' to a floating plate 74 in the manner hereinafter described. The links 66 and 68 are preferably of equal length and disposed parallel to each other with the points 70, 70' of attachment to the reciprocative plate 58 being spaced from each other at a distance equal to the distance between the attachment points 72, 72' of the links to the floating plate 74.

A second or Y step motor 76 is also secured to the bottom of the table 26 and is connected through a flexible coupling 78 to a second or Y shaft 80. The Y lead shaft 80 is also disposed with its axis parallel to the table 26 and is journaled for rotation in bearings 82. The outer end of the Y lead shaft is prevented against axial displacement by the interaction of a collar 84 and spring plunger 86 in the manner described before in relation to the X lead shaft. A second rotary to linear motion conversion unit 88 is mounted on the Y shaft 80, which unit has a second or Y reciprocative plate 90 secured to it as by screws. Stakes 92 maintain the second reciprocative plate 90 parallel to the table by cooperating spring plungers and Teflon shoes in the manner described above. The Y lead shaft 80 is disposed in a substantially perpendicular relationship to the X lead shaft 36, and the Y reciprocative plate 90 has an outrigger 99 extending inwardly toward the floating plate 74 from which outrigger a second linkage means such as a Y link 96 is pivotally secured at 98. The other end of the Y link 96 is pivotally secured to the floating plate 74 at 100.

With reference now to FIG. 3, typical spring loaded pivotal connections of the links 66, 68 and 96 are illustrated with regard to link 66. A bolt 102 passes through an aperture 104 provided in the end of the link 66 and is threaded into the floating plate 74 at 106. The head of the bolt 102 has a spherical belly which bears against a lubricating O-ring 108 such as of Teflon positioned in a shoulder 110 formed in the link 66 to reduce any friction which would be produced by relative rotary motion between the link 66 and the floating plate 74. The bolt 102 is securely fastened to the floating plate 74 by a nut 112 threaded on the bolt between the link and the floating plate, and a spring member 114 secured to the link 66 as by a screw passes over the outer end of the bolt 102 to complete the pivotal connection 72. Similarly the other end of the link 66 is pivotally secured to the first reciprocative plate 58 at 70 by a bolt 116 passing through an aperture 118 in the plate 58 and threaded into the link 66 at 120. The bolt 16 is secured to the link 66 by a nut 119 while with the plate 58. An overlying spring member 124 secured to the plate 58 completes the pivot 70.

To secure the floating plate 74 to the chessman plate 24, a spacer plate 126 passes through a cutout portion 127 of the table 26 and is adhered to the lower surface of the chessman plate 24 and is secured to the upper surface of the floating plate 74 by screws. The thickness of the spacer plate 126 is chosen so as to align the bottom surface of the chessman plate indicated at 128 with the upper surface of the table indicated at 130. The latter two surfaces preferably have a lubricating coating, such as Teflon, to lubricate any movement between them.

Figure 4:
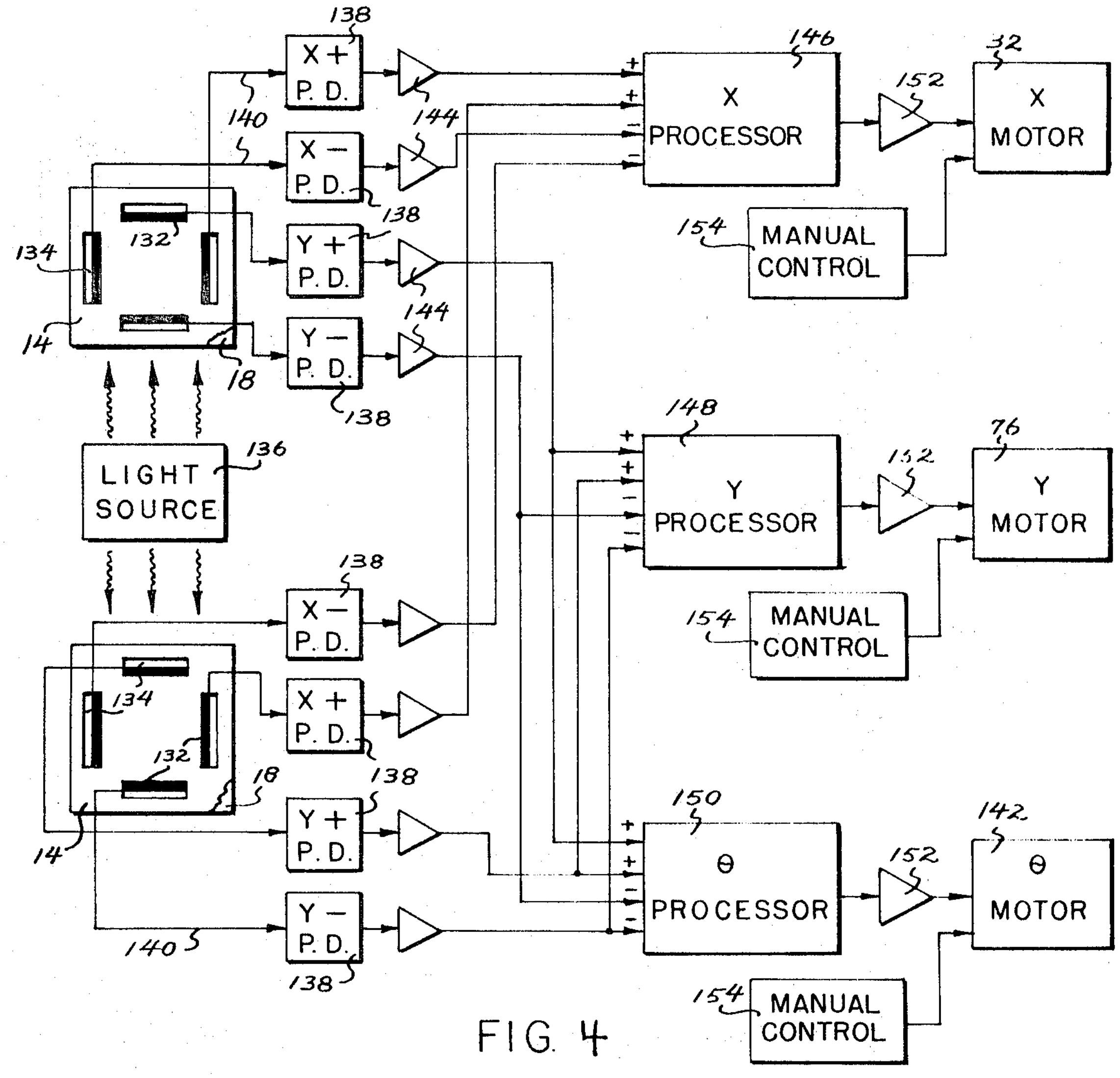
FIG. 4 is a diagrammatic representation of the electrical circuitry of the invention.

The discussion will now focus on the energizing circuitry for the step motors 32 and 76 with reference to FIG. 4 which illustrates in block diagram form an electrooptical, light balanced, null seeking, incremental movement mask-to-wafer alignment system. The purpose of the system is to align the semiconductor wafer 18 to the mask 14 which is superposed on and in contact with the wafer. To accomplish this, the wafer has printed thereon a target 132, portions of which are visible in FIG. 4 through mask apertures 134.

The target 132 has a different light reflection characteristic from the surrounding background areas of the wafer 18. Thus, when the mask-wafer combination is illuminated by light from source 136, the amount of light reflected back through the mask apertures or windows will be a function of the relative amounts of the target and wafer background that are visible through the windows. It will be appreciated that when the mask and wafer are aligned, as shown in FIG. 4, equal amounts of reflected energy will be transmitted through the mask windows 134. The reflected light from each mask window is optically coupled to corresponding photodetectors 138. The optical coupling of the reflected light is indicated representationally in FIG. 4 by the light path lines 140.

Two separate mask-to-wafer target alignment stations are employed to obtain the necessary positioning information to actuate the incremental movement drive system, X, Y and $\theta$ motors, 32, 76 and 142, respectively. The outputs from photodetectors 138 are amplified by amplifiers 144 and inputed to the appropriate X, Y or $\theta$ processors 146, 148 and 150, respectively, which perform the following combinational signal processing:

$$E_X = \mathrm{Sgn}\,(X_{1+} + X_{2+} - X_{1'7E'} - X_{2'7E'})$$
$$E_Y = \mathrm{Sgn}\,(Y_{1+} + Y_{2+} - Y_{1'7E'} - Y_{2'7E'})$$
$$E\theta = \mathrm{Sgn}\,(Y_{1+} + Y_{2'7E'} - Y_{1'7E'} - Y_{2+})$$

where the first subscript represents Station Number and the second subscript represents the sign of the photodetector and where $E_X$, $E_Y$ and $E\theta$ are the outputs from the respective processors.

The $E_X$, $E_Y$ and $E\theta$ error signals from the corresponding processors are amplified by amplifiers 152 and applied as drive signals to the X, Y and $\theta$ motors which incrementally step the wafer with respect to the mask in the appropriate X, Y and $\theta$ directions. When the mask and the wafer are properly aligned with respect to each other, the signal outputs from the X, Y and $\theta$ processors are zero.

In certain situations it may be desirable to initially actuate one or more of the three incremental motors 32, 76 and 142 by manual control. Accordingly, a source of suitable drive signals 154 is provided to permit manual control of each motor individually.

It should now be apparent that any motion imparted to the reciprocative plates 58 and 90 will cause a corresponding motion of the floating plate 74 within a predetermined plane, that plane in this case being the surface of the table 26. To insure motion within this plane, the X and Y lead shafts 36 and 80 provide movement paths for the reciprocative plates 58 and 90 disposed parallel to that plane. The lead shafts are preferably disposed perpendicularly to each other, although any nonparallel relationship between the shafts 36 and 80 will give some mobility to the floating plate 74.

Since the particular point of attachment between the chessman 22 and the chessman plate 24 varies from time to time, and will rarely be on the center of rotation for the plate, it is desirable to prevent the chessman plate 24 from rotating during its planar movement so that the chessman 22 moves in accordance with the movement of the X and Y reciprocative plates 58 and 90. To that end, one of the linkage means, here the X linkage, includes two parallel links 66 and 68 of equal length which define a parallelograph with the lines defined by their pivots 70, 70' to the first reciprocative plate 58 and the pivots 72, 72' to the floating plate 74 to insure nonrotative, planar motion of the chessman plate 24.

The combination of the driving apparatus 30 to produce nonrotative planar motion for the chessman plate 24 with the input circuitry shown in FIG. 4 provides for rapid automatic planar registration of the mask and wafer targets.

Having thus described the preferred embodiment of my invention for illustrative purposes, it is my intention to cover all modifications and equivalents thereof which fall within the spirit and scope of the appended claims.

I claim:

1. In an apparatus for registering a movable object with a stationary object of the type having a mechanism for positioning said movable object in a predetermined plane defined by an X axis and a Y axis to accomplish such registration, a planar registering assembly comprising: means for generating an X off register signal in response to an off register condition relative to the X axis; means for generating a Y off register signal in response to an off register condition relative to the Y axis; a first reciprocative element; means for reciprocating said first reciprocative element in a path parallel to said X axis in response to said X off register signal; a second reciprocative element; means for moving said second reciprocative element in a path parallel to said Y axis in response to said Y off register signal; a floating member operatively connected to said movable object positioning mechanism; a first linkage means pivotally secured to said floating member at one end and pivotally secured to said first reciprocative element at its other end; and a second linkage means pivotally secured at one end to said floating member and pivotally secured to said second reciprocative element at its other end, said two linkage means supporting said floating member in a plane parallel to said predetermined plane, whereby said floating member may be moved and positioned within a plane parallel to said predetermined plane in response to said off register signals to register the stationary and movable objects.

2. The apparatus of claim 1 in which said first linkage means comprises: two links of equal length, each of said links being pivotally secured to said first reciprocative element at one end and to said floating member at the other end with the distance between the points at which said two links are pivotally secured to said first reciprocative element being equal to the distance between the points at which said two links are pivotally secured to said floating member, thereby insuring nonrotative planar movement of said floating member.

3. The apparatus of claim 2 in which said first and second reciprocating means each comprise an electrically responsive step motor having a lead shaft rotatively mounted with its axis parallel to said predetermined plane, which is further characterized by said first lead shaft being disposed perpendicularly to said second lead shaft whereby said first and second lead shafts define perpendicular linear movement paths for said reciprocative elements.

4. In a device having a manually operable means for moving a workpiece support in a predetermined plane including a linkage interconnecting the workpiece and a manually movable linkage actuator for moving said workpiece into register with another object, the improvement comprising: a floating plate; means for securing said manually movable linkage actuator to said floating plate in a manually releasable manner; and means responsive to the misregistration of said workpiece and said object for moving said floating plate and hence said manually movable linkage actuator in a plane parallel to said predetermined plane until said workpiece and object are registered, thereby imparting said device with automatic and manual registration capabilities.

* * * * *

PO-1050
(5/69)

UNITED STATES PATENT OFFICE
CERTIFICATE OF CORRECTION

Patent No. 3,622,856 Dated November 23, 1971

Inventor(s) Gordon Willis

It is certified that error appears in the above-identified patent and that said Letters Patent are hereby corrected as shown below:

Column 3, line 23, change "99" to -- 94--;

Column 4, lines 14-16 the equations should be corrected to read:

$$E_X = \text{Sgn}\ (X_{1+} + X_{2+} - X_{1-} - X_{2-})$$

$$E_Y = \text{Sgn}\ (Y_{1+} + Y_{2+} - Y_{1-} - Y_{2-})$$

$$E_\Theta = \text{Sgn}\ (Y_{1+} + Y_{2-} - Y_{1-} - Y_{2+})$$

Signed and sealed this 16th day of May 1972.

(SEAL)
Attest:

EDWARD M.FLETCHER, JR.
Attesting Officer

ROBERT GOTTSCHALK
Commissioner of Patents